US012727258B2

(12) United States Patent
Jang et al.

(10) Patent No.: US 12,727,258 B2
(45) Date of Patent: Sep. 1, 2026

(54) LIGHT TRANSMISSION TYPE-SOLAR CELL MODULE, AND METHOD OF MANUFACTURING THE SAME

(71) Applicant: MECAROENERGY CO., LTD., Chungcheongbuk-do (KR)

(72) Inventors: Hyuk Kyoo Jang, Cheongju-si (KR); Gyu Hyun Lee, Chungju-si (KR); Soon Yong Lim, Cheongju-si (KR); Chan Seon Lee, Cheonan-si (KR); Tae Woo Eom, Chungcheongbuk-do (KR)

(73) Assignee: MECAROENERGY CO., LTD., Chungcheongbuk-do (KR)

( * ) Notice: Subject to any disclaimer, the term of this patent is extended or adjusted under 35 U.S.C. 154(b) by 0 days.

(21) Appl. No.: 18/390,100

(22) Filed: Dec. 20, 2023

(65) Prior Publication Data

US 2024/0213387 A1 Jun. 27, 2024

(30) Foreign Application Priority Data

Dec. 23, 2022 (KR) ........................ 10-2022-0183366

(51) Int. Cl.
*H10F 19/80* (2025.01)
*H10F 71/00* (2025.01)

(52) U.S. Cl.
CPC ......... *H10F 19/807* (2025.01); *H10F 71/137* (2025.01)

(58) Field of Classification Search
CPC ................................ H10F 71/137; H10F 71/00
See application file for complete search history.

(56) References Cited

U.S. PATENT DOCUMENTS

| | | | | |
|---|---|---|---|---|
| 2002/0011641 A1* | 1/2002 | Oswald | H10F 19/31 | 438/96 |
| 2010/0126559 A1* | 5/2010 | Cunningham | H10F 19/80 | 438/73 |
| 2014/0162408 A1* | 6/2014 | Brunton | H10F 19/33 | 219/121.67 |
| 2016/0126376 A1* | 5/2016 | Jeong | H10F 19/33 | 438/95 |
| 2020/0279962 A1* | 9/2020 | Heiss | H10F 19/33 | |

FOREIGN PATENT DOCUMENTS

KR 10-2204686 B1 1/2021

* cited by examiner

*Primary Examiner* — Eli S Mekhlin
(74) *Attorney, Agent, or Firm* — You & IP, LLC

(57) ABSTRACT

Disclosed is a light transmission type-solar cell module, and a manufacturing method thereof, the manufacturing method of the light transmission type-solar cell module comprising: a first step of forming a thin-film solar cell comprising solar cell patterns by patterning a thin-film solar cell layer located on a glass substrate; a second step of disposing a transparent adhesion layer on the thin-film solar cell; and a third step of adhering a cover glass substrate onto the transparent adhesion layer, wherein the first step is to form the thin-film solar cell comprising the solar cell patterns in such a manner as to pattern the thin solar cell layer located on the glass substrate by carrying out etching using a laser.

6 Claims, 9 Drawing Sheets

| Active/Passive width | 1 mm / 0.5 mm | 1 mm / 0.25 mm | 1 mm / 0.125 mm |
|---|---|---|---|
| LIGHT TRANSMITTANCE | (33 %) | (20 %) | (11 %) |
| EFFICIENCY | 8.1 % | 9.2 % | 10.8 % |

FIG. 9

LIGHT TRANSMISSION TYPE-SOLAR CELL MODULE, AND METHOD OF MANUFACTURING THE SAME

CROSS-REFERENCE TO RELATED APPLICATION

This application claims priority to Korean Patent Application No. 10-2022-0183366, filed on Dec. 23, 2022, in the Korean Intellectual Property Office, the entire contents of which are hereby incorporated by reference.

BACKGROUND OF THE INVENTION

Field of the Invention

The present invention relates to a light transmission type-solar cell module, and a method of manufacturing the light transmission type-solar cell module, and more particularly, to a light transmission type-solar cell module, and a manufacturing method thereof that improve the efficiency of output all the more as well as enhancing the transmittance of sunrays and the characteristic of an esthetic feeling.

Description of the Related Arts

Under the actual circumstances that movements of each country in the world to take measures to cope with climatic crises have recently accelerated, and policies for a declaration of carbon neutrality, and the popularization and spread of new renewable energy, and so on have also accelerated, a necessity for developing solar cells has been increasing from day to day. In particular, as an interest in buildings with zero energy, and so on have increased, markets for building integrated photo voltaic (BIPV) which applies solar cells to buildings have been expanding.

In the present solar cell market, although most of solar cells are silicon solar cells, since silicon is opaque, and an esthetic feeling is poor in terms of its characteristic, an interest in new solar cells for the application of BIPV has been increasing.

Due to this reason, recently researches for transparent solar cells have actively been carried out, but a solar cell having a 50% or more transmission rate shows the efficiency of energy conversion in just a 5% standard.

Accordingly, it is necessary to develop technologies relating to a solar cell module which can be applied to windows and doors, and the like thanks to its practical light transmission as well as its excellent esthetic feeling.

PRIOR ART DOCUMENT

Patent Document

Patent Document 1: Korean Patent No. 10-2204686 (Jan. 20, 2021)

SUMMARY OF THE INVENTION

The present invention has been devised for solving the aforesaid problems, and an object of the present invention is to provide a light transmission type-solar cell module and a manufacturing method thereof that improve the efficiency of output all the more as well as enhancing the transmittance of sunrays and the characteristic of an esthetic feeling.

In accordance with one exemplary embodiment of the present invention for solving the aforesaid problems, a method of manufacturing a light transmission type-solar cell module may comprise: a first step of forming a thin-film solar cell comprising solar cell patterns by patterning a thin-film solar cell layer located on a glass substrate; a second step of disposing a transparent adhesion layer on the thin-film solar cell; and a third step of adhering a cover glass substrate onto the transparent adhesion layer, wherein the first step is to form the thin-film solar cell comprising the solar cell patterns by patterning the thin-film solar cell layer located on the glass substrate through etching using a laser.

In accordance with another exemplary embodiment of the present invention, the first step may be to form the thin-film solar cell comprising the solar cell patterns in line type disposed at regular intervals.

In accordance with another exemplary embodiment of the present invention, the first step may be to form the thin-film solar cell comprising the solar cell patterns in line type disposed at the intervals ranging from 0.124 mm to 0.5 mm, and each having a width of 0.1 mm to 10 mm.

In accordance with another exemplary embodiment of the present invention, the laser may be a nanosecond laser, a picosecond laser, or a femtosecond laser.

In accordance with another exemplary embodiment of the present invention, the laser may be an ultraviolet (UV) laser whose wavelength is 532 nm, or an infrared (IR) laser whose wavelength is 1032 nm.

In accordance with another exemplary embodiment of the present invention, the first step may be to form the thin-film solar cell comprising the solar cell patterns by patterning the thin-film solar cell layer in such a manner as to carry out etching using the laser with respect to a surface on which the thin-film solar cell layer located on the glass substrate is formed.

In accordance with another exemplary embodiment of the present invention, the first step is to form the solar cell patterns by patterning the thin-film battery layer in such a manner as to carry out etching using the laser with respect to the other surface opposite to the surface on which the thin-film solar cell layer located on the glass substrate is formed.

In accordance with another exemplary embodiment of the present invention, the first step may be to form the thin-film solar cell comprising the solar cell patterns disposed in a check pattern form which shows that light transmission parts in great numbers having their respective square shapes, and the solar cell patterns in great numbers having their respective square shapes cross in order.

In accordance with another exemplary embodiment of the present invention, the first step may be to form a pattern connection part configured to connect the solar cell patterns in great numbers having their respective square shapes to one another by patterning the thin-film solar cell layer.

In accordance with another exemplary embodiment of the present invention, the first step may be to form the pattern connection part so as to connect the solar cell patterns, which are disposed to cross mutually in one direction from the thin-film solar cell, to one another.

In accordance with another exemplary embodiment of the present invention, a light transmission type-solar cell module, may comprise: a thin-film solar cell comprising solar cell patterns formed in such a manner as to pattern a thin-film battery layer located on a glass substrate; a transparent adhesion layer disposed on the thin-film solar cell; and a cover glass substrate adhered onto the transparent adhesion layer, wherein the thin-film solar cell is formed to include the solar cell patterns in such a manner as to pattern the thin-film solar cell layer located on the glass substrate by carrying out etching using a laser.

In accordance with another exemplary embodiment of the present invention, the thin-film solar cell may comprise the solar cell patterns in line type disposed at regular intervals.

In accordance with another exemplary embodiment of the present invention, the thin-film solar cell may comprise the solar cell patterns in line type disposed at the intervals ranging from 0.124 mm to 0.5 mm, and each having a width of 0.1 mm to 10 mm.

In accordance with another exemplary embodiment of the present invention, the thin-film solar cell may be configured in such a manner that the solar cell patterns in great numbers having their respective square shapes are disposed in a check pattern form to cross in order.

In accordance with another exemplary embodiment of the present invention, the light transmission type-solar cell module may further comprise a pattern connection part configured to connect the solar cell patterns in great numbers having their respective square shapes.

In accordance with another exemplary embodiment of the present invention, the pattern connection part may connect the solar cell patterns, which are disposed to cross mutually in one direction from the thin-film solar cell, to one another.

In accordance with the other exemplary embodiment of the present invention, each of the solar cell patterns may be composed of a large number of unit cells for solar cell, and width A of the pattern connection part may be formed to be identical with or larger than that B of the unit cell for solar cell.

In accordance with the present invention, the light transmission type-solar cell module, and the manufacturing method thereof that improve the efficiency of output all the more as well as enhancing the transmittance of sunrays and the characteristic of an esthetic feeling can be provided.

BRIEF DESCRIPTION OF THE DRAWINGS

FIG. 9 and FIG. 10 are views for more fully describing the method of manufacturing the light transmission type-solar cell module according to said one exemplary embodiment.

DETAILED DESCRIPTION OF THE INVENTION

Figure 1:
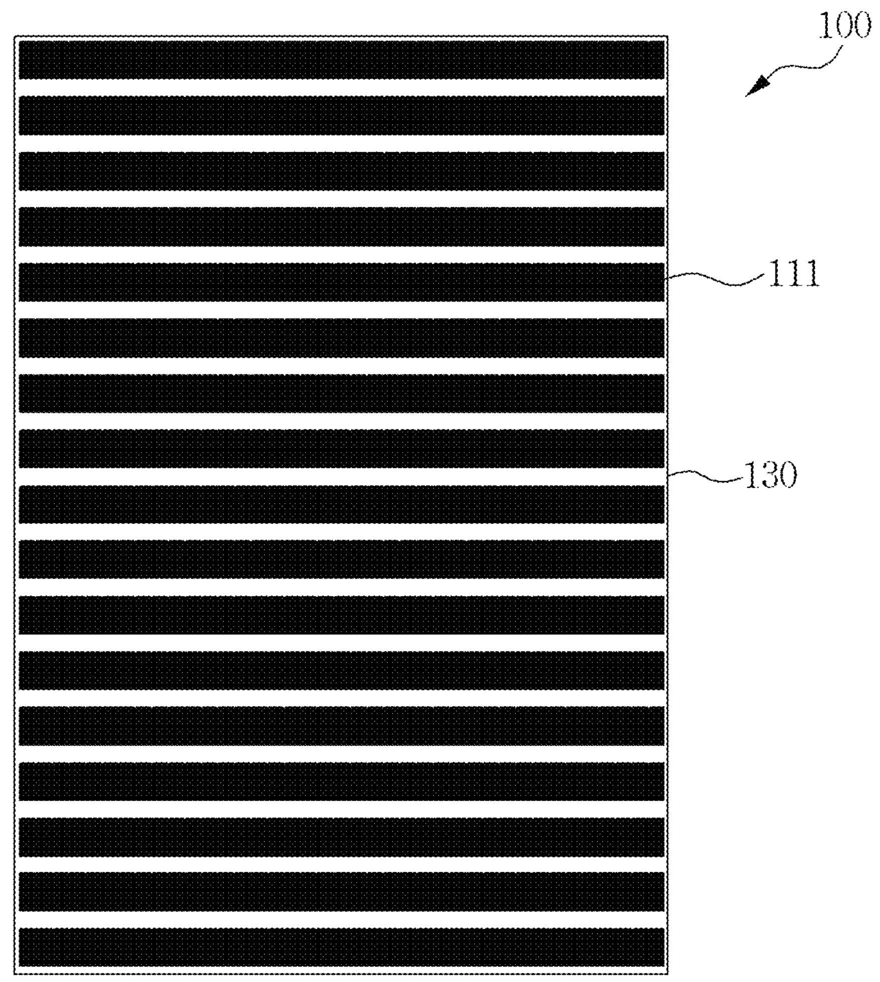
FIG. 1 is a front view of a light transmission type-solar cell module according to one exemplary embodiment of the present invention.

The present invention is convertible variously and can have various exemplary embodiments, and the specific exemplary embodiments are illustrated in the drawings and are described in detail in the detailed description. However, they shouldn't be regarded as limiting the present invention to specific embodied forms, but should be understood as including all the modifications, equivalents, or alternations included in the idea and the technical scope of the present invention.

However, with respect to the description for the embodied forms, it is to be noted that, when the detailed description of widely known functions or constitutions related with the present invention may make the gist of the present invention unnecessarily unclear, the detailed description thereof will be omitted. Also, it should be understood that the sizes of the constituent elements shown in the drawings may exaggeratedly be drawn for the description, and do not mean actually applied sizes.

Also, throughout the present specification, when it is described that one constituent element "is connected" or "linked" to another constituent element, although said one constituent element may directly be connected or may directly be linked to said another constituent element, it should be understood that these constituent elements may be connected or linked to each other via the other constituent element therebetween, unless the context clearly indicates otherwise. Also, throughout the present specification, when it is described that a part "comprises" a constituent element, this means that the part may further comprise the other constituent elements rather than excluding the other constituent elements, unless the context clearly indicates otherwise.

Figure 2:
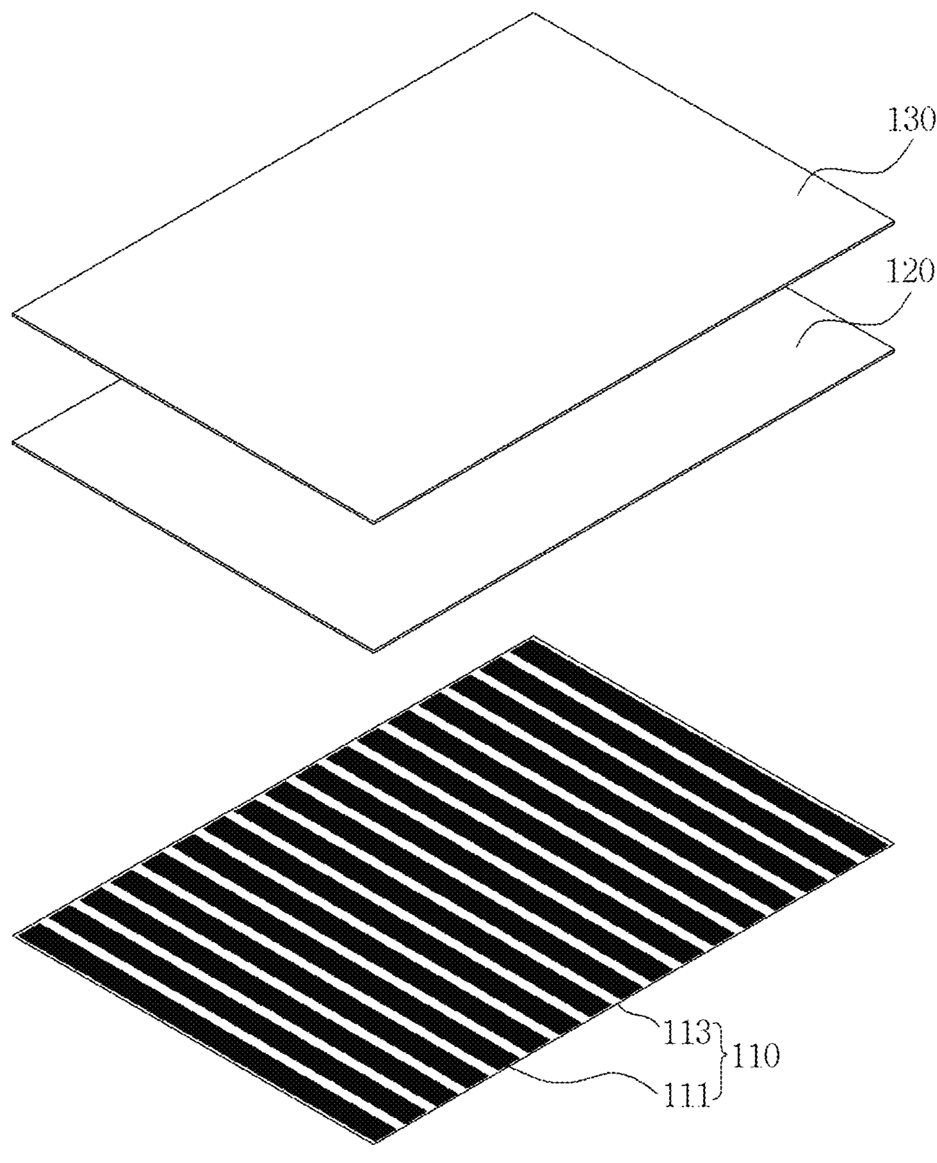
FIG. 2 is a disjointed perspective view of the light transmission type-solar cell module according to said one exemplary embodiment of the present invention.

FIG. 1 is a front view of a light transmission type-solar cell module according to one exemplary embodiment of the present invention, and FIG. 2 is a disjointed perspective view of the light transmission type-solar cell module according to said one exemplary embodiment of the present invention.

Hereinafter, a constitution of the light transmission type-solar cell module according to said one exemplary embodiment of the present invention is described with reference to FIG. 1 and FIG. 2.

The light transmission type-solar cell module 100 according to said one exemplary embodiment of the present invention comprises a thin-film solar cell 110, a transparent adhesion layer 120, and a cover glass substrate 130.

The thin-film solar cell 110 comprises a large number of solar cell patterns 111, and the solar cell patterns 111 are formed in such a manner as to pattern a thin-film solar cell layer located on a glass substrate 113. The thin-film solar cell layer may be composed of copper, indium, gallium, and selenium (CIGS).

More specifically, when the solar cell patterns 111 are formed, the thin-film solar cell layer located on the glass substrate 113 is patterned using a laser.

At this time, according to another exemplary embodiment, the solar cell patterns 111 may be formed in such a manner as to form a shielding part at the thin-film solar cell layer located on the glass substrate 113 using a mask, and to carry out patterning using bead blast finish or a sanding device.

Also, the transparent adhesion layer 120 is disposed on the thin-film solar cell 110 so as to cause the cover glass substrate 130 to adhere to the thin-film solar cell 110, and the transparent adhesion layer 120 may be composed of an ethylene vinyl acetate (EVA) film.

At this time, the thin-film solar cell 110 comprises solar cell patterns 111 in line type which are disposed at regular intervals.

The solar cell patterns in line type may be formed in such a manner as to carry out patterning through etching in a widthwise direction of unit cells of the thin-film solar cell layer located on the glass substrate 130 using a laser.

More specifically, the thin-film solar cell 110 may be configured in such a manner that the solar cell patterns in line type each having a width of 0.1 mm to 10 mm are disposed at intervals ranging from 0.124 mm to 0.5 mm.

Also, like the solar cell patterns 111, a pattern connection part 112 is formed in such a manner as to pattern the thin-film solar cell layer.

At this time, the pattern connection part 112 may be formed to connect the solar cell patterns in great numbers having their respective square shapes, which are disposed in one direction from the thin-film solar cell.

Figure 3:
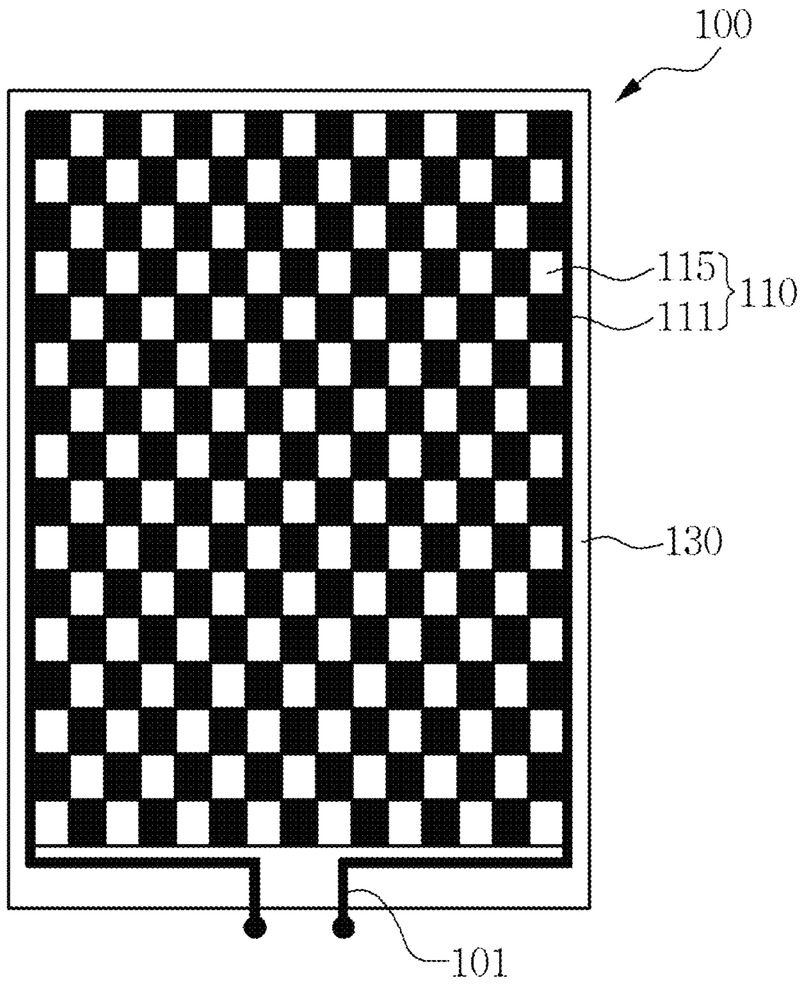
FIG. 3 is a front view of a light transmission type-solar cell module according to another exemplary embodiment of the present invention.
Figure 4:
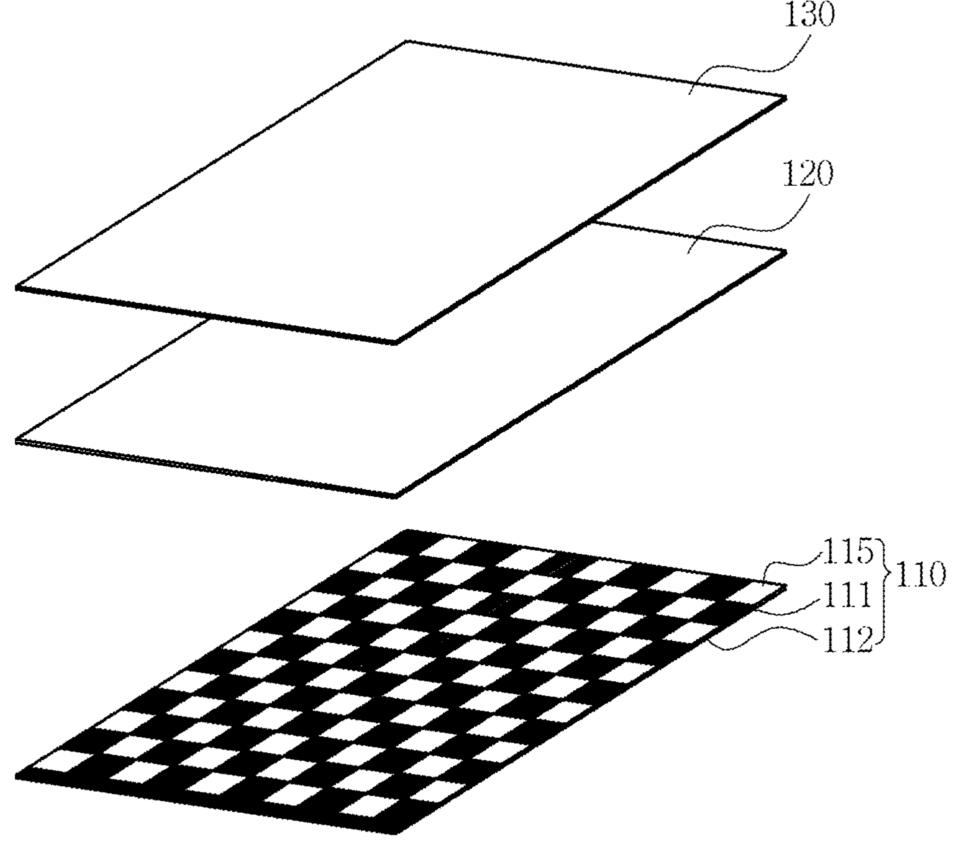
FIG. 4 is a disjointed perspective view of the light transmission type-solar cell module according to said another exemplary embodiment of the present invention.

FIG. 3 is a front view of a light transmission type-solar cell module according to another exemplary embodiment of the present invention. FIG. 4 is a disjointed perspective view of the light transmission type-solar cell module according to said another exemplary embodiment of the present invention.

Figure 5:
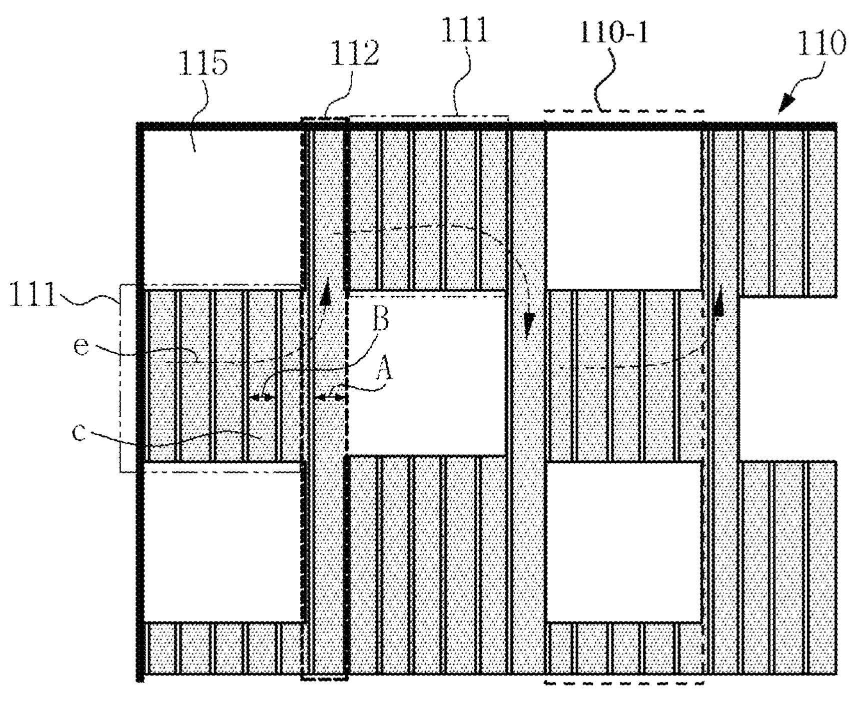
FIG. 5 and FIG. 6 are views for describing solar cell patterns of the light transmission type-solar cell module according to said one exemplary embodiment.
Figure 6:
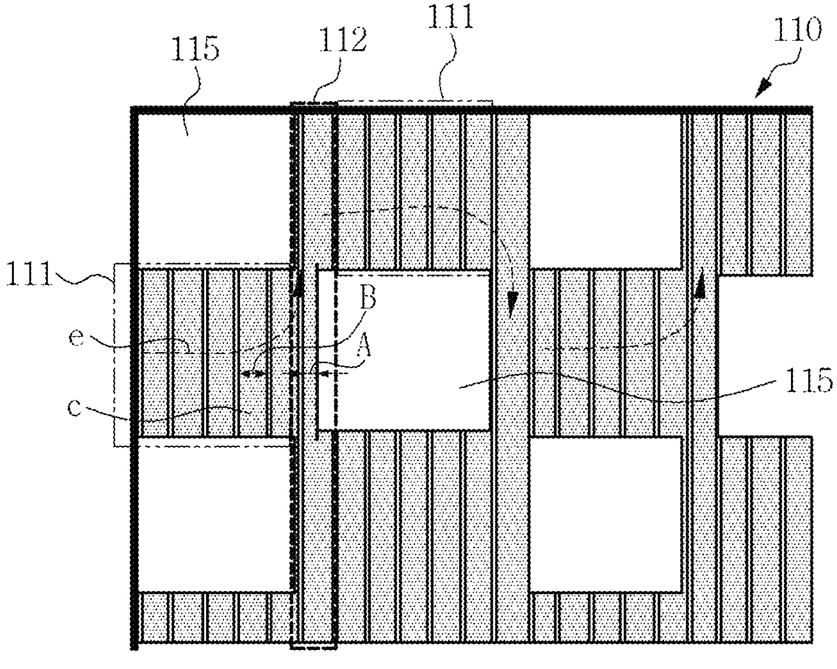

Also, FIG. 5 and FIG. 6 are views for describing the solar cell patterns of the light transmission type-solar cell module according to said one exemplary embodiment.

Hereinafter, a constitution of the light transmission type-solar cell module according to another exemplary embodiment of the present invention is described with reference to FIG. 4 to FIG. 6.

The light transmission type-solar cell module according to said another exemplary embodiment of the present invention comprises the thin-film solar cell 110, the transparent adhesion layer 120, and the cover glass substrate 130.

The thin-film solar cell 110 comprises a large number of solar cell patterns 111, and the solar cell patterns 111 are formed in such a manner as to pattern the thin-film solar cell layer located on the glass substrate 113. The thin-film solar cell layer and the solar cell patterns 111 may be composed of CIGS.

More specifically, when the solar cell patterns 111 are formed, these solar cell patterns 111 may be formed in such a manner as to pattern the thin-film solar cell layer located on the glass substrate 112 using a laser, or to form a shielding part at the thin-film solar cell layer located on the glass substrate 113 using a mask and to carry out patterning using bead blast finish or a sanding device.

Also, the transparent adhesion layer 120 is disposed on the thin-film solar cell 110 so as to cause the glass substrate 130 to adhere to the thin-film solar cell 110, and the transparent adhesion layer 120 may be composed of an ethylene vinyl acetate (EVA) film.

At this time, the thin-film solar cell 110 is configured to be disposed in a check pattern form which shows that a large number of light transmission parts 115 having their respective square shapes, and a large number of solar cell patterns 111 having their respective square shapes cross in order.

That is, as shown in the exemplary embodiment based on FIG. 1 and FIG. 2, after the solar cell patterns 111 in line type are formed in such a manner as to carry out patterning through etching in a widthwise direction of unit cells of the thin-film solar cell layer located on the glass substrate 130 using a laser, patterning is additionally carried out through etching in the lengthwise direction of the unit cells of the thin-film solar cell layer using a laser, so the solar cell patterns 111 having their respective check pattern-like shapes may be formed.

Also, referring to FIG. 5, the pattern connection part 112 may be configured to connect the solar cell patterns 111 in great numbers having their respective square shapes to one another. Like the solar cell patterns, the pattern connection part 112 configured as described is formed in such a manner as to pattern the thin-film solar cell layer. For the convenience of explanation, the thin-film solar cell 110 may be divided into a plurality of thin-film solar cell sub-sections 110-1 arranged in parallel to one another. That is, the thin-film solar cell 110 may be formed such that each of the thin-film solar cell sub-sections 110-1 includes a plurality of the solar cell patterns 111 and light transmission parts 115 arranged alternatively in series. Each of the pattern connection parts 112 is placed between neighboring two thin-film solar cell sub-sections 110-1 to connect the two thin-film solar cell sub-sections 110-1.

At this time, the pattern connection part 112 may be formed to connect the solar cell patterns 111 in great numbers having their respective square shapes, which are disposed in one direction from the thin-film solar cell.

With the more detailed explanation, the solar cell patterns 111 may be disposed to cross each other in one direction, and the pattern connection part 112 may be formed to connect the solar Based on this constitution, the solar cell patterns 111 and the pattern connection part 112 are connected to each other via various paths so that a current of electricity E can easily flow.

At this time, as shown in FIG. 5, it is preferable that each of the solar cell patterns is composed of a large number of unit cells for solar cell C, and width A of the pattern connection part 112 is configured to be identical with or larger than width B of the unit cell for solar cell C.

As shown in FIG. 6, in case that the width A of the pattern connection part 112 is smaller than that B of the unit cell for solar cell C, this may be a factor of causing an increase in resistance, which disturbs a current of electricity E. Thus, according to said one exemplary embodiment of the present invention, as shown in FIG. 3, the width A of the pattern connection part 112 is formed to be identical with or larger than that B of the unit cell for solar cell C so that a current of electricity E is not disturbed from flowing.

Figure 7:
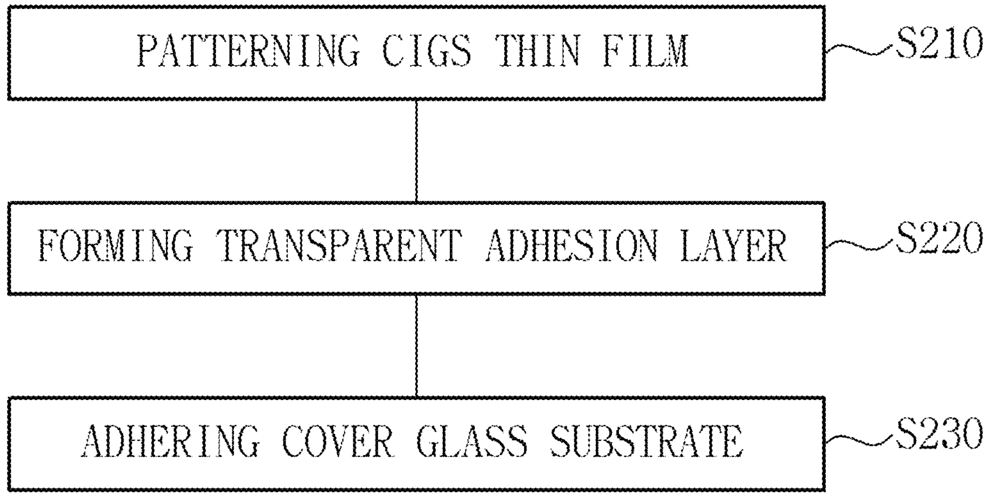
FIG. 7 is a flow chart for describing a method of manufacturing a light transmission type-solar cell module according to some exemplary embodiments.
Figure 8:
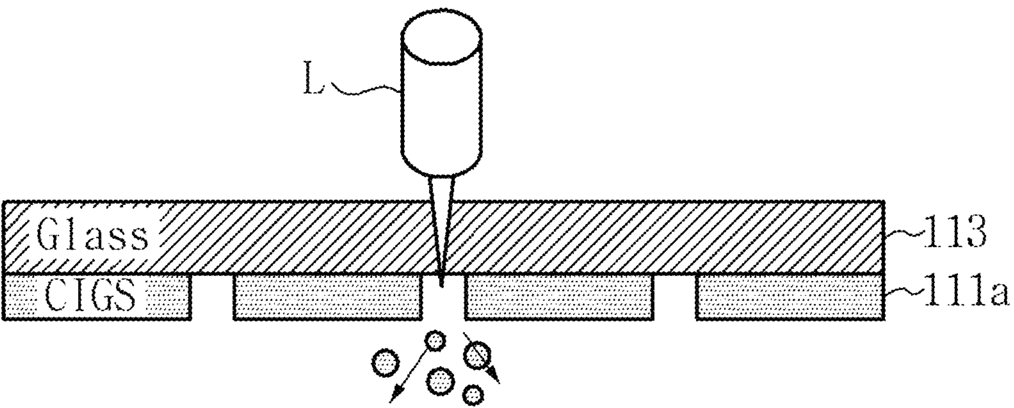
FIG. 8 is a view for more fully describing the method of manufacturing the light transmission type-solar cell module according to said some exemplary embodiments.

FIG. 7 is a flow chart for describing a method of manufacturing the light transmission type-solar cell module according to some exemplary embodiments of the present invention, and FIG. 8 is a view for more fully describing the method of manufacturing the light transmission type-solar cell module according to said some exemplary embodiments of the present invention.

Figure 9:
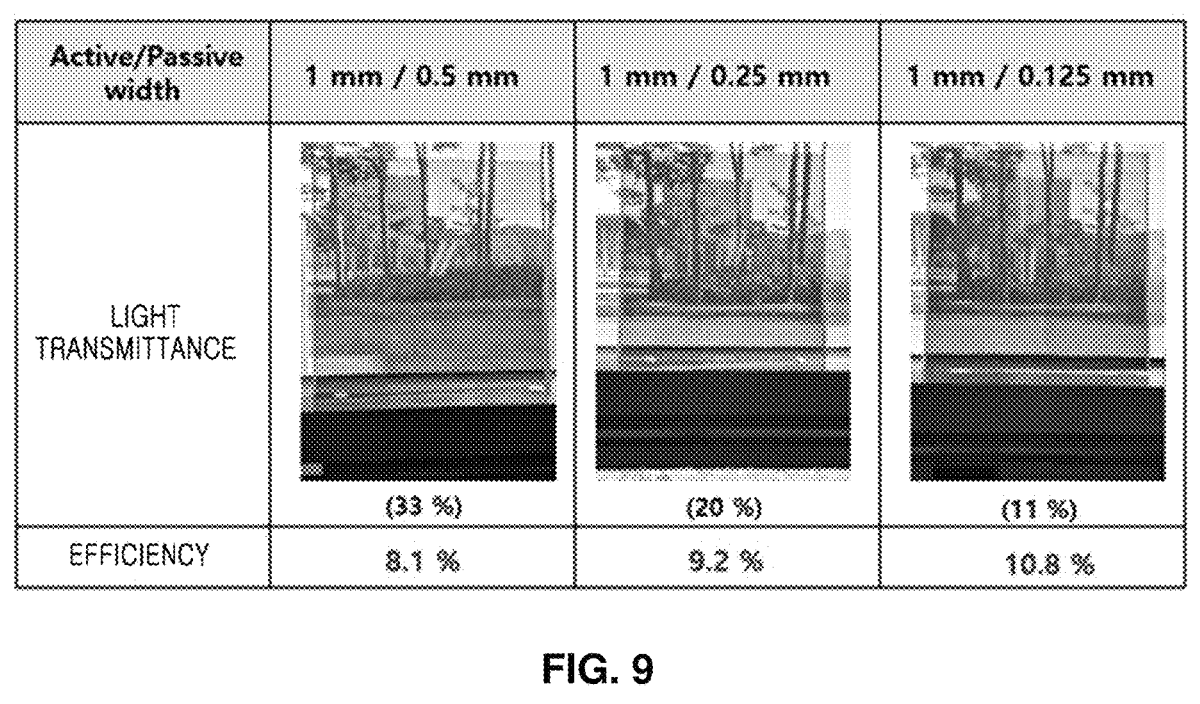
Figure 10:
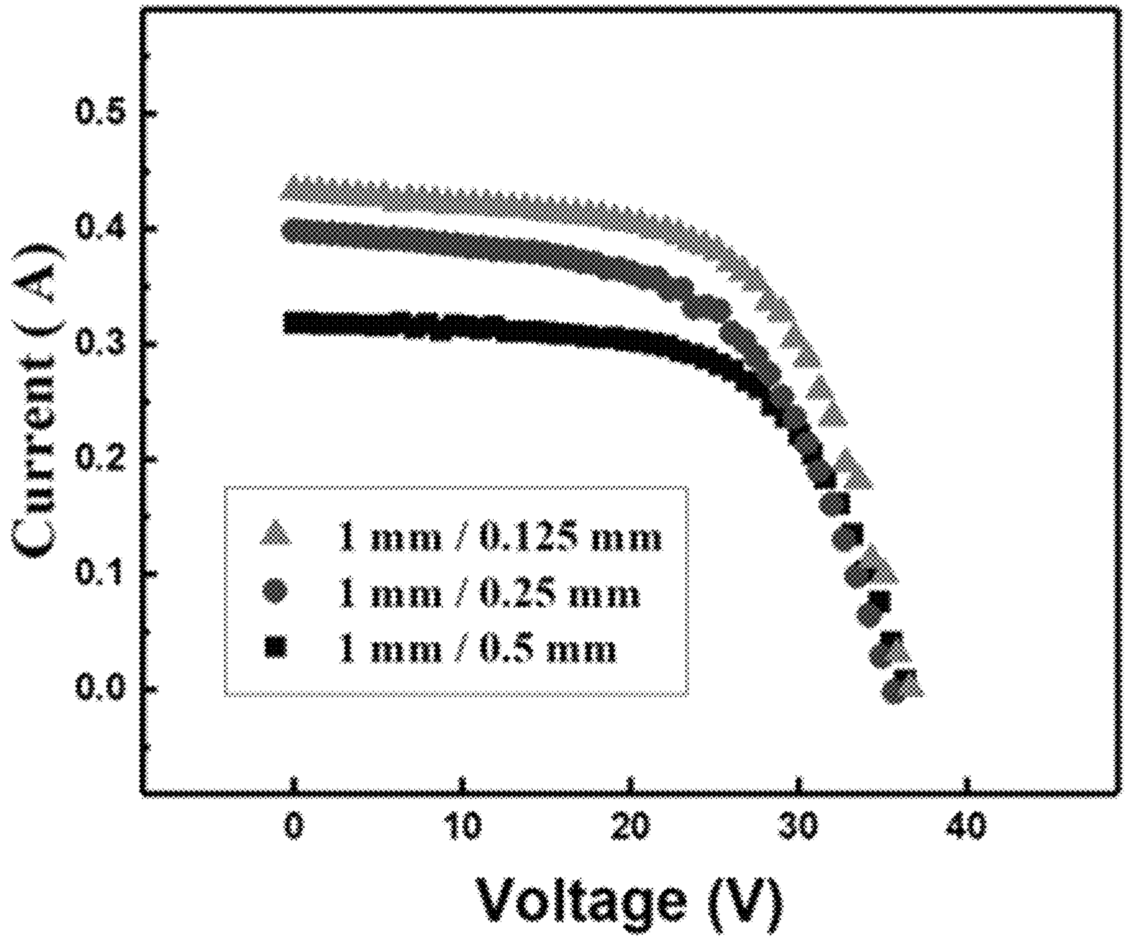
Figure 11:
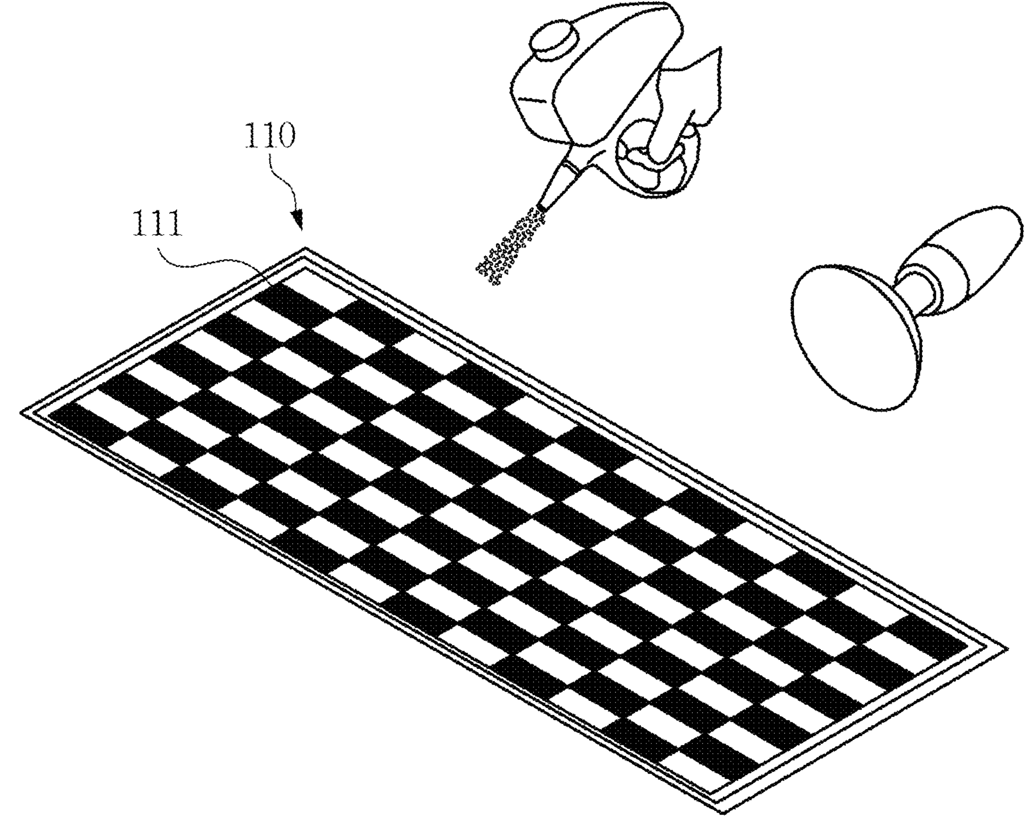
FIG. 11 is a view for more fully describing the method of manufacturing the light transmission type-solar cell module according to said another exemplary embodiment.

Also, FIG. 9 and FIG. 10 are views for more fully describing the method of manufacturing the light transmission type-solar cell module according to said one exemplary embodiment of the present invention, and FIG. 11 is a view for more fully describing the method of manufacturing the light transmission type-solar cell module according to said another exemplary embodiments of the present invention.

Hereinafter, the method of manufacturing the light transmission type-solar cell module according to said one exemplary embodiment of the present invention is described in more detail with reference to FIG. 7 to FIG. 11.

First, as the thin-film solar cell layer located on the glass substrate 113 is patterned, the thin-film solar cell 110 comprising the solar cell patterns 111 is formed S210. At this time, the thin-film solar cell comprising the solar cell patterns 111 may be formed in such a manner to pattern the thin-film solar cell layer located on the glass substrate 130 by carrying out etching using a laser.

More specifically, according to said one exemplary embodiment of the present invention, the thin-film solar cell comprising the solar cell patterns 111 in line type which are disposed at regular intervals may be formed. The solar cell patterns 111 in line type may be formed in such a manner as to perform patterning through etching in a widthwise direction of the unit cells of the thin-film solar cell layer using a laser.

At this time, the thin-film solar cell 110 may be configured in such a manner that the solar cell patterns 111 in line type each having a width of 0.1 mm to 10 mm are disposed at intervals ranging from 0.124 mm to 0.5 mm.

Referring to FIG. 9, in case that the solar cell patterns in line type each having the width of 1 mm were disposed at the intervals of 0.5 mm, 33% light transmittance and 8.1% output efficiency occurred, in case that the solar cell patterns in line type each having the width of 1 mm are disposed at the intervals of 0.25 mm, 20% light transmittance and 9.2% output efficiency occurred, and in case that the solar cell patterns in line type each having the width of 1 mm are disposed at the intervals of 0.125 mm, 11% light transmittance and 10.8% output efficiency occurred.

Also, FIG. 10 illustrates each output current and output voltage of the light transmission type-solar cell module according to said one exemplary embodiment of the present invention, and referring to FIG. 10, as the interval between each of the solar cell patterns decreases gradually in order in the range of 0.5 mm, 0.25 mm, and 0.125 mm, each output current under the same output voltage increases, so it may be found that as the interval between each of the solar cell patterns decreases, the output efficiency increases.

Meanwhile, according to the other exemplary embodiment of the present invention, when the thin-film solar cell 110 comprising the solar cell patterns 111 is formed in such a manner as to pattern the thin-film solar cell layer located on the glass substrate 113, the thin-film solar cell 110 is formed in such a manner that a large number of light transmission parts 115 having their respective square shapes, and a large number of solar cell patterns 111 having their respective square shapes are disposed in a check pattern form to cross in order.

With the explanation in more detail, after the solar cell patterns 111 in line type are formed in such a manner as to carry out patterning through etching in a widthwise direction of the unit cells of the thin-film solar cell layer located on the glass substrate 130 using a laser, patterning is additionally carried out through etching using a laser in the widthwise direction of the unit cells of the thin-fil solar cell layer, so the solar cell patterns 111 having their respect check pattern-like shapes may be formed.

At this time, as the thin-film solar cell layer is patterned, the pattern connection part 112 configured to connect the solar cell patterns 111 in great numbers having their respective square shapes to one another may be formed, and more specifically, the pattern connection part 112 may be formed to connect the solar cell patterns 111 disposed to cross mutually in one direction from the thin-film solar cell 111.

Meanwhile, as described above, when the thin-film solar cell layer is patterned, the solar cell patterns 111 may be formed in such a manner as to pattern the thin-film solar cell layer located on the glass substrate 113 using a laser beam irradiated from a laser device L, or as shown in FIG. 11, the solar cell patterns 111 may be formed in such a manner as to form a shielding part at the thin-film solar cell layer located on the glass substrate using a mask, and to carry out patterning using bead blast finish or a sanding device.

Like this, when the thin-film solar cell layer is patterned, the thin-film solar cell layer located on the glass substrate 113 is patterned through etching using a laser, so the thin-film solar cell comprising the solar cell patterns may be formed.

At this time, a nanosecond laser, a picosecond laser, or a femtosecond laser may be used in the laser. Also, an ultraviolet (UV) laser whose wavelength is 532 mm, or an infrared (IR) laser whose wavelength is 1032 nm may be used in the laser.

Also, when said patterning is carried out using the laser, the thin-film solar cell layer is patterned in such a manner as to carry out etching using the laser with respect to the other surface opposite to the surface on which the thin-film solar cell layer located on the glass substrate 113 is formed, so the solar cell patterns 111 may be formed, or the thin-film solar cell layer is patterned in such a manner as to carry out etching using the laser with respect to the surface on which the thin-film solar cell layer is formed, so the solar cell patterns 111 may be formed.

After this, a terminal 101 is formed at the thin-film solar cell 110.

On the thin-film solar cell 110 formed as described above is disposed the transparent adhesion layer 120 S220, and the solar cell module 100 is completed by a lamination process of adhering the cover glass substrate onto the transparent adhesion layer 120 S230.

Like this, with respect to the light transmission type-solar cell module according to the present invention, since a portion of the thin film is removed at the time of patterning the thin-film solar cell, an electrical connection can be realized using a characteristic of the thin film itself without an additional metal connection, so the solar cell module completely having a solar cell function as well as the characteristic of an esthetic feeling and the characteristic of light transmission while facilitating work can be provided.

As previously described, in the detailed description of the invention, have been described the specific exemplary embodiments of the invention. However, it is to be understood that various modifications can be made without deviating from the idea and the scope of the present invention. The technical idea of the present invention should not be construed as being limited to the aforesaid exemplary embodiments according to the present invention, but should be fixed by the claims and equivalents thereof.

What is claimed is:

1. A method of manufacturing a light transmission type-solar cell module, the method comprising:

forming a thin-film solar cell comprising a plurality of solar cell patterns by patterning a thin-film solar cell layer located on a glass substrate;

disposing a transparent adhesion layer on the thin-film solar cell; and adhering a cover glass substrate onto the transparent adhesion layer, wherein the thin-film solar cell is formed through etching using a laser, wherein:

the thin-film solar cell comprises a plurality of thin-film solar cell sub-sections arranged in parallel to one another;

the thin-film solar cell further includes a plurality of pattern connection parts, each of the pattern connection parts being placed between neighboring two thin-film solar cell sub-sections to connect the two thin-film solar cell sub-sections;

each of the thin-film solar cell sub-sections includes a plurality of the solar cell patterns and light transmission parts arranged alternatively in series;

each of the solar cell patterns is composed of a plurality of unit cells (c) having a predetermined width; and a width of each of the pattern connection parts is greater than the predetermined width of a unit cell.

2. The method of claim 1, wherein the laser is a nanosecond laser, a picosecond laser, or a femtosecond laser.

3. The method of claim 1, wherein the laser is an ultraviolet (UV) laser whose wavelength is 532 nm, or an infrared (IR) laser whose wavelength is 1032 nm.

4. The method of claim 1, wherein the thin-film solar cell comprising the solar cell patterns by patterning the thin-film solar cell layer is formed in such a manner as to carry out etching using the laser with respect to a surface on which the thin-film solar cell layer located on the glass substrate is formed.

5. The method of claim 1, wherein the solar cell patterns by patterning the thin-film battery layer is formed in such a manner as to carry out etching using the laser with respect to other surface opposite to the surface on which the thin-film solar cell layer located on the glass substrate is formed.

6. The method of claim 1, wherein the thin-film solar cell comprises the solar cell patterns disposed in a check pattern form which shows that the light transmission parts having their respective square shapes, and the solar cell patterns having their respective square shapes cross in order.

* * * * *